United States Patent
Du et al.

(10) Patent No.: US 12,414,432 B2
(45) Date of Patent: Sep. 9, 2025

(54) OLED DISPLAY PANEL AND DISPLAY DEVICE

(71) Applicant: Shenzhen China Star Optoelectronics Semiconductor Display Technology Co., Ltd., Guangdong (CN)

(72) Inventors: Lingyu Du, Shenzhen (CN); Jinchuan Li, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/760,848

(22) PCT Filed: Feb. 25, 2022

(86) PCT No.: PCT/CN2022/078004
§ 371 (c)(1),
(2) Date: Mar. 16, 2022

(87) PCT Pub. No.: WO2023/151137
PCT Pub. Date: Aug. 17, 2023

(65) Prior Publication Data
US 2024/0206222 A1    Jun. 20, 2024

(30) Foreign Application Priority Data
Feb. 14, 2022  (CN) .......................... 202210134518.9

(51) Int. Cl.
*H10K 50/816*     (2023.01)
*C08G 77/00*      (2006.01)
(Continued)

(52) U.S. Cl.
CPC ........... *H10K 50/816* (2023.02); *C08G 77/26* (2013.01); *H10K 50/818* (2023.02); *H10K 85/40* (2023.02);
(Continued)

(58) Field of Classification Search
CPC .... H10K 50/816; H10K 50/818; H10K 85/40; H10K 2102/311; H10K 59/10; H10K 50/81; C08G 77/26; C08G 77/80
See application file for complete search history.

(56) References Cited

U.S. PATENT DOCUMENTS 4,963,788 A * 10/1990 King .......................... G09F 9/33
                                                     313/503
10,833,132 B2 * 11/2020 Shigemura ........... H10K 50/844
(Continued)

FOREIGN PATENT DOCUMENTS

CN     102097438 A  *  6/2011
CN     106531768 A      3/2017
(Continued)

OTHER PUBLICATIONS

International Search Report in International application No. PCT/CN2022/078004, mailed on Jul. 1, 2022.
(Continued)

*Primary Examiner* — William B Partridge
*Assistant Examiner* — Felix B Andrews
(74) *Attorney, Agent, or Firm* — Nathan & Associates Patent Agents Ltd.; Menachem Nathan

(57) ABSTRACT

The present application provides an OLED display panel and a display device. The OLED display panel includes a substrate and an anode disposed on the substrate, wherein the anode includes a first conductive body layer and a self-repairing layer, and the self-repairing layer is located on a side of the first conductive body layer close to the substrate.

15 Claims, 2 Drawing Sheets

(51) Int. Cl.
- *C08G 77/26* (2006.01)
- *H10K 50/818* (2023.01)
- *H10K 85/40* (2023.01)
- *H10K 102/00* (2023.01)

(52) U.S. Cl.
CPC ........ *C08G 77/80* (2013.01); *H10K 2102/311* (2023.02)

(56) References Cited

U.S. PATENT DOCUMENTS

| | | | |
|---|---|---|---|
| 2005/0029800 A1* | 2/2005 | Disano | B42D 25/373 283/91 |
| 2011/0031480 A1* | 2/2011 | Nakamura | H10K 59/878 257/E51.026 |
| 2016/0372699 A1* | 12/2016 | Baisl | H10K 50/8423 |
| 2017/0278873 A1 | 9/2017 | Yang | |
| 2020/0111845 A1* | 4/2020 | Shigemura | H10K 50/844 |
| 2020/0161397 A1 | 5/2020 | Pang | |
| 2020/0388790 A1* | 12/2020 | Yamazaki | G06V 40/12 |
| 2020/0409420 A1* | 12/2020 | Nakamura | G06F 1/3265 |
| 2021/0191468 A1* | 6/2021 | Nakamura | G02B 1/14 |
| 2021/0202748 A1* | 7/2021 | Haick | H01L 29/24 |
| 2022/0016874 A1* | 1/2022 | Li | C09D 165/00 |
| 2022/0041787 A1* | 2/2022 | Rabnawaz | C08G 18/61 |
| 2022/0051594 A1* | 2/2022 | Eguchi | H05K 5/0226 |
| 2024/0032331 A1* | 1/2024 | Wan | H10K 59/1201 |
| 2024/0040910 A1* | 2/2024 | Cao | H10K 59/124 |

FOREIGN PATENT DOCUMENTS

| | | | |
|---|---|---|---|
| CN | 106549021 A | | 3/2017 |
| CN | 109994643 A | | 7/2019 |
| CN | 111048619 A | * | 4/2020 |
| CN | 111825872 A | * | 10/2020 |
| CN | 113124745 A | | 7/2021 |
| CN | 115547541 A | * | 12/2022 |
| CN | 115651247 A | * | 1/2023 |

OTHER PUBLICATIONS

Written Opinion of the International Search Authority in International application No. PCT/CN2022/078004, mailed on Jul. 1, 2022.
Chinese Office Action issued in corresponding Chinese Patent Application No. 202210134518.9 dated Jun. 27, 2024, pp. 1-6.
Chinese Office Action issued in corresponding Chinese Patent Application No. 202210134518.9 dated May 17, 2025, pp. 1-4.
Chinese Office Action issued in corresponding Chinese Patent Application No. 202210134518.9 dated Mar. 1, 2025, pp. 1-19.
A Journal of "An autonomously ultrafast self-healing, highly colourless, tear-resistant and compliant elastomer tailored for transparent electromagnetic interference shielding films integrated in flexible and optical electronics", pp. 1-12.

* cited by examiner

OLED DISPLAY PANEL AND DISPLAY DEVICE

TECHNICAL FIELD

The present application relates to a technical field of display, in particular to an OLED display panel and a display device.

BACKGROUND

Organic light-emitting diode (OLED) display panels have become a hot topic in recent years because of their advantages such as self-illuminating, low power consumption, flexible, small sized, easy-to-carry, and shape variability. Compared to a conventional display using glass substrate as a substrate, the OLED display can be folded multiple times, and the OLED display has a longer service life and a lower production cost, making wearable devices possible.

Technical Problems

In a present OLED display, an anode has a large brittleness, and therefore, when an OLED display is bent or folded multiple times, the anode can easily crack or even break, thereby reducing a service life of the OLED display.

SUMMARY

Embodiments of the present application provide an OLED display panel and a display device to extend a service life of the OLED display.

The present application provides an organic light-emitting diode (OLED) display panel, wherein the OLED display panel comprises:
a substrate; and
an anode comprising a first conductive body layer and a self-repairing layer, wherein the self-repairing layer is located on a side of the first conductive body layer close to the substrate.

Optionally, in some embodiments of the present application, the self-repairing layer comprises a self-repairing material, and the self-repairing material comprises one or more of polydimethylsiloxane-4,4'-methylene phenyl isocyanate, polydimethylsiloxane-4,4'-4,4'-hexamethylenebiurea, or polydimethylsiloxane-4,4'-methylene phenyl isocyanate-4,4'-hexamethylenebiurea.

Optionally, in some embodiments of the present application, a thickness of the self-repairing layer ranges from 80 nm to 150 nm.

Optionally, in some embodiments of the present application, the self-repairing layer further comprises a reflective material; the reflective material comprises at least one of silver, palladium, copper, aluminum, nickel, or lanthanum; or
the reflective material comprises an alloy consisting of at least two of silver, palladium, copper, aluminum, nickel, or lanthanum.

Optionally, in some embodiments of the present application, the anode further comprises a second conductive body layer, the second conductive body layer is located on a side of the self-repairing layer close to the substrate, and a material of the second conductive body layer is same as a material of the first conductive body layer.

Optionally, in some embodiments of the present application, the material of the first conductive body layer and the material of the second conductive body layer are indium tin oxide, the material of the self-repairing layer comprises the polydimethylsiloxane-4,4'-methylene phenyl isocyanate-4,4'-hexamethylenebiurea and sliver nanowire; and
a thickness of the first conductive body layer and a thickness of the second conductive body layer both range from 5 nm to 12 nm, and the thickness of the self-repairing layer ranges from 80 nm to 150 nm.

Optionally, in some embodiments of the present application, the anode further comprises a reflective layer located on a side of the self-repairing layer away from the first conductive body layer.

Optionally, in some embodiments of the present application, the anode further comprises a reflective layer located on a side of the self-repairing layer close to the first conductive body layer.

Optionally, in some embodiments of the present application, the self-repairing layer is prepared by a coating process or a vapor deposition process.

The present application provides an organic light-emitting diode (OLED) display panel, wherein, the OLED display panel comprises:
a substrate; and
an anode comprising a first conductive body layer and a self-repairing layer, wherein the self-repairing layer is located on a side of the first conductive body layer close to the substrate, the self-repairing layer comprises a self-repairing material comprising one or more of polydimethylsiloxane-4,4'-methylene phenyl isocyanate, polydimethylsiloxane-4,4'-4,4'-hexamethylenebiurea, or polydimethylsiloxane-4,4'-methylene phenyl isocyanate-4,4'-hexamethylenebiurea, and a thickness of the self-repairing layer is 80 nm-150 nm.

An embodiment of the present application further provides a display device comprising an OLED display panel, wherein the OLED display panel comprises:
a substrate; and
an anode comprising a first conductive body layer and a self-repairing layer, wherein the self-repairing layer is located on a side of the first conductive body layer close to the substrate.

Optionally, in some embodiments of the present application, the self-repairing layer comprises a self-repairing material, and the self-repairing material comprises one or more of polydimethylsiloxane-4,4'-methylene phenyl isocyanate, polydimethylsiloxane-4,4'-4,4'-hexamethylenebiurea, or polydimethylsiloxane-4,4'-methylene phenyl isocyanate-4,4'-hexamethylenebiurea.

Optionally, in some embodiments of the present application, a thickness of the self-repairing layer ranges from 80 nm to 150 nm.

Optionally, in some embodiments of the present application, the self-repairing layer further comprises a reflective material: the reflective material comprises at least one of silver, palladium, copper, aluminum, nickel, or lanthanum; or
the reflective material comprises an alloy consisting of at least two of silver, palladium, copper, aluminum, nickel, or lanthanum.

Optionally, in some embodiments of the present application, the anode further comprises a second conductive body layer, the second conductive body layer is located on a side of the self-repairing layer close to the substrate, and a material of the second conductive body layer is same as a material of the first conductive body layer.

Optionally, in some embodiments of the present application, the material of the first conductive body layer and the material of the second conductive body layer are indium tin oxide, the material of the self-repairing layer comprises the polydimethylsiloxane-4,4'-methylene phenyl isocyanate-4,4'-hexamethylenebiurea and sliver nanowire.

Optionally, in some embodiments of the present application, a thickness of the first conductive body layer and a thickness of the second conductive body layer both range from 5 nm to 12 nm, and the thickness of the self-repairing layer ranges from 80 nm to 150 nm.

Optionally, in some embodiments of the present application, the anode further comprises a reflective layer on a side of the self-repairing layer away from the first conductive body layer.

Optionally, in some embodiments of the present application, the anode further comprises a reflective layer located on a side of the self-repairing layer close to the first conductive body layer.

Optionally, in some embodiments of the present application, the self-repairing layer is prepared by a coating process or a vapor deposition process.

BENEFICIAL EFFECTS

Compared with an OLED display panel in the prior art, an OLED display panel provided in the present application is provided with a self-repairing layer in an anode, and the self-repairing layer is located on a side of a first conductive body layer close to a substrate. By utilizing a self-repairing performance of the self-repairing layer, a mechanical performance damage of the anode can be repaired. Further, when the OLED display panel is bent or folded multiple times, a probability of cracking of the anode can be reduced, so that a reliability of a light-emitting device can be improved, and a service life of the OLED display panel can be prolonged.

BRIEF DESCRIPTION OF THE DRAWINGS

In order to more clearly illustrate the technical solutions in the embodiments of the present application, the accompanying drawings required for use in the description of the embodiments will be briefly described below. It will be apparent that the accompanying drawings in the following description are merely some embodiments of the present application, and other drawings may be obtained from these drawings without creative effort by those skilled in the art.

DETAILED DESCRIPTION OF THE EMBODIMENTS

Figure 1:
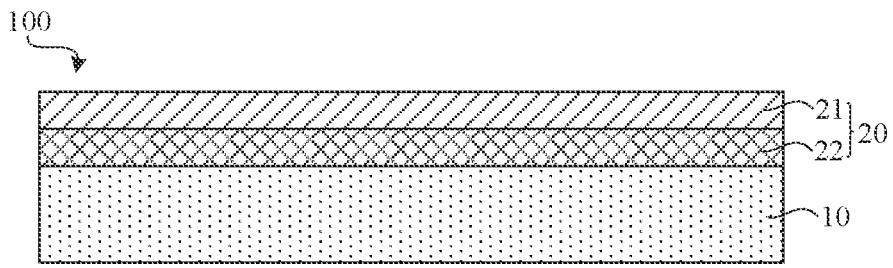
FIG. 1 is a structural schematic diagram of an OLED display panel according to a first embodiment of the present application.

The following describes the technical solutions of the embodiments of the present application in a clear and complete manner with reference to the accompanying drawings in the embodiments of the present application. It will be apparent that the described embodiments are only a part of the embodiments of the present application, but not all of the embodiments. Based on the embodiments of the present application, all other embodiments obtained by those skilled in the art without creative effort fall within the scope of the present application. Furthermore, it should be understood that the specific embodiments described herein are intended only to illustrate and explain the present application and are not intended to limit the present application. The terms "up" and "down" are used in the present application in the absence of a reverse description, generally referring to the upper and lower parts of the device in actual use or operation, in particular in the drawing direction: and the terms "in" and "outside" are for the profile of the device.

The present application provides an OLED display panel and a display device. Detailed description will be illustrated below.

The present application provides an OLED display panel including a substrate and an anode disposed on the substrate. The anode includes a first conductive body layer and a self-repairing layer. The self-repairing layer is located on a side of the first conductive body layer close to the substrate.

As such, the OLED display panel provided in the present application is provided with a self-repairing layer in the anode, and the self-repairing layer is located on the side of the first conductive body layer close to the substrate. By utilizing a self-repairing performance of the self-repairing layer, a mechanical performance damage of the anode can be repaired. Further, when the OLED display panel is bent or folded multiple times, a probability of cracking of the anode can be reduced, so reliability of a light-emitting device can be improved, and a service life of the OLED display panel can be prolonged.

The OLED display panel provided in this application will be described in detail below by specific embodiments. It should be noted that an order of description of the following embodiments is not a limitation on a preferred order of the embodiments.

Referring to FIG. 1, a first embodiment of the present application provides an OLED display panel 100. The OLED display panel 100 includes a substrate 10 and an anode 20 disposed on the substrate 10. The anode 20 includes a first conductive body layer 21 and a self-repairing layer 22. The self-repairing layer 22 is located on a side of the first conductive body layer 21 close to the substrate 10.

In the present embodiment, the substrate 10 includes a flexible substrate and an array layer (not shown) disposed on the flexible substrate. Wherein the flexible substrate may include a flexible material such as polyimide, polyethylene terephthalate, acrylic resin, or epoxy resin. The array layer may include a structure (not shown) such as a thin film transistor. The related art is prior art, and details are not described here.

Specifically, a material of the first conductive body layer 21 may be indium tin oxide or indium zinc oxide. The indium tin oxide has a high work function which can reach 4.5 eV-4.8 eV, and has good conductivity, stable chemical properties, and high transparency. Therefore, in the present embodiment, the material of the first conductive body layer 21 is indium tin oxide.

In this embodiment, the first conductive body layer 21 is prepared by a physical vapor deposition process. Wherein, a thickness of the first conductive body layer 21 ranges from 5 nm to 12 nm. In some embodiments, the thickness of the first conductive body layer 21 may be 5 nm, 6 nm, 7 nm, 8 nm, 9 nm, 10 nm, 11 nm, or 12 nm.

The self-repairing layer 22 comprises a self-repairing material. Specifically, the self-repairing material includes one or more of polydimethylsiloxane-4,4'-methylene phenyl isocyanate, polydimethylsiloxane-4,4'-4,4'-hexamethylenebiurea, and polydimethylsiloxane-4,4'-methylene phenyl isocyanate-4,4'-hexamethylenebiurea. Since the self-repairing material has a self-repairing property at room temperature, the self-repairing material can have a good repairing effect on a mechanical performance of the self-repairing layer 22 itself, thereby facilitating improvement of a bending performance of the anode 20.

In this example, the self-repairing material is polydimethylsiloxane-4,4'-methylene phenyl isocyanate-4,4'-hexamethylenebiurea. Since a hydrogen bond inside the polydimethylsiloxane-4,4'-methylene phenyl isocyanate-4,4'-hexamethylenebiurea has a rapid dissociation and reconstruction capability, and a molecular chain in the self-repairing material has a rapid movement capability, the self-repairing material has an extremely fast self-repairing rate and an extremely high self-repairing efficiency, and can be completely repaired to an original mechanical performance of the self-repairing layer 22 at room temperature. Specifically, in a case where the OLED display panel 100 in the present embodiment is bent or folded multiple times, even if the self-repairing layer 22 is cracked or even broken, the self-repairing layer itself can repair a position of a crack or a break, so as to improve the bending performance of the self-repairing layer 22, and further improve the whole bending performance of the anode 20, so as to prolong the service life of the OLED display panel 100.

In addition, since the polydimethylsiloxane-4,4'-methylene phenyl isocyanate-4,4'-hexamethylenebiurea has a high transparency (a transparency up to 94% or more), excellent tear resistance (a tensile strength greater than 800%), and good electrical conductivity, the present embodiment can also improve a transparency, tear resistance, and electrical conductivity of the anode 20, thereby improving luminance, mechanical performance, and stability of the OLED display panel 100.

Further, the self-repairing layer 22 is prepared by a coating process or a vapor deposition process. The coating process may be slit coating, spin coating, scratch coating, spray coating, or the like. In this embodiment, the self-repairing layer 22 is prepared by a vapor deposition process. Wherein, a thickness of the self-repairing layer ranges from 80 nm to 150 nm. In some embodiments, the thickness of the self-repairing layer may be 80 nm, 90 nm, 100 nm, 110 nm, 120 nm, 130 nm, 140 nm, or 150 nm.

Preferably, in some embodiments, the self-repairing material may also be polydimethylsiloxane-4,4'-hexamethylenebiurea, which is not described here.

The OLED display panel 100 in this embodiment further includes a light-emitting layer, a cathode, and an encapsulation layer (not shown) sequentially disposed on the anode. The related art is prior art, and details are not described here.

Figure 2:
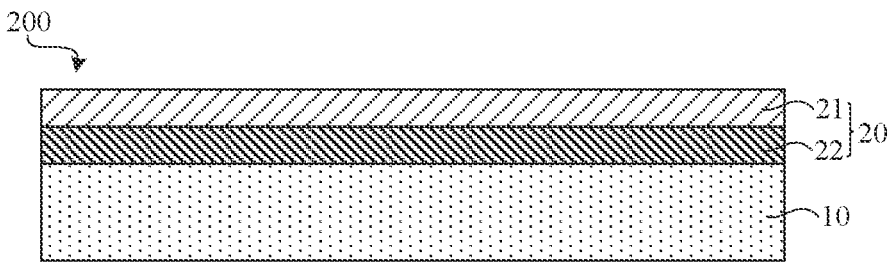
FIG. 2 is a structural schematic diagram of an OLED display panel according to a second embodiment of the present application.

Referring to FIG. 2, a second embodiment of the present application provides an OLED display panel 200. The OLED display panel 200 provided in the second embodiment of the present application differs from the first embodiment in that the self-repairing layer 22 of the OLED display panel 200 further includes a reflective material including at least one of silver, palladium, copper, aluminum, nickel, or lanthanum.

In this embodiment, by adding the reflective material to the self-repairing layer 22, a reflective performance of the self-repairing layer can be improved, and a reflective performance of the anode 20 can be improved, so that a light emission efficiency and a light emission uniformity of the OLED display panel 200 can be improved. Further, since the reflective material has good conductivity, it is possible to improve conductivity of the self-repairing layer to improve conductivity of the anode 20, thereby improving an emission performance of the OLED display panel 200.

In this embodiment, the reflective material is silver, and specifically, the reflective material may be silver nanowire. Because the silver nanowire have high transparency and good conductivity, the silver nanowire doped with polydimethylsiloxane-4,4'-methylene phenyl isocyanate-4,4'-hexamethylenebiurea can improve the transparency and conductivity of the anode 20 while improving the bending performance of the anode 20, thereby improving the light emission effect and the light emission performance of the OLED display panel 200.

In some embodiments, the reflective material includes an alloy consisting of at least two of silver, palladium, copper, aluminum, nickel, and lanthanum. Alternatively, the reflective material may include at least one of silver, palladium, copper, aluminum, nickel, or lanthanum, and an alloy consisting of at least two of silver, palladium, copper, aluminum, nickel, and lanthanum, which will not be described here.

Figure 3:
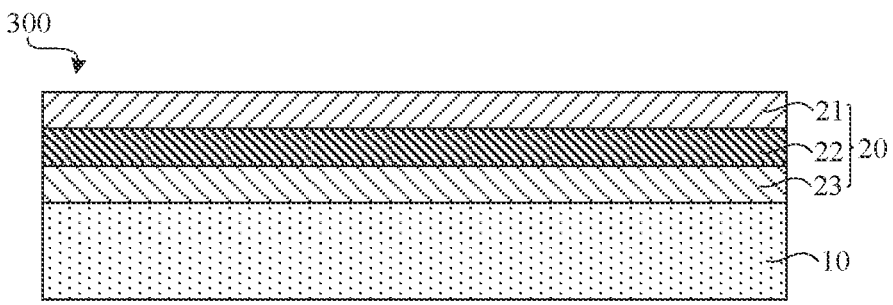
FIG. 3 is a structural schematic diagram of an OLED display panel according to a third embodiment of the present application.

Referring to FIG. 3, a third embodiment of the present application provides an OLED display panel 300. The OLED display panel 300 provided in the third embodiment of the present application differs from the second embodiment in that the anode 20 further includes a second conductive body layer 23 located on a side of the self-repairing layer 22 close to the substrate 10.

In this embodiment, a material of the second conductive body layer 23 is same as the material of the first conductive body layer 21, and is indium tin oxide.

Specifically, the second conductive body layer 23 is prepared by a physical vapor deposition process. Wherein, a thickness of the second conductive body layer 23 ranges from 5 nm to 12 nm. In some embodiments, the thickness of the second conductive body layer 23 may be 5 nm, 6 nm, 7 nm, 8 nm, 9 nm, 10 nm, 11 nm, or 12 nm.

Figure 4:
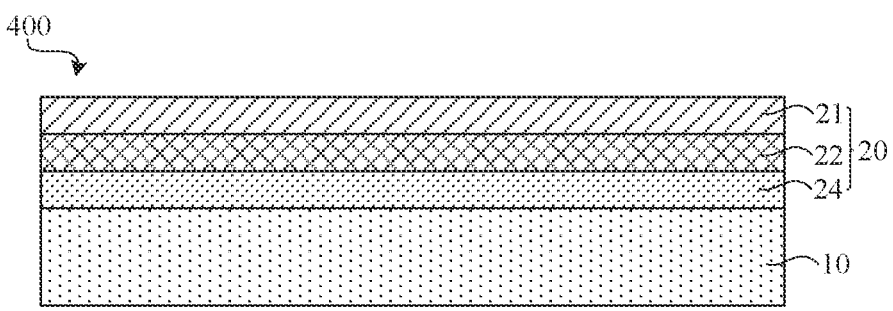
FIG. 4 is a structural schematic diagram of an OLED display panel according to a fourth embodiment of the present application.

Referring to FIG. 4, a fourth embodiment of the present application provides an OLED display panel 400. The OLED display panel 400 provided in the fourth embodiment of the present application differs from the first embodiment in that the anode 20 further includes a reflective layer 24 on a side of the self-repairing layer 22 away from the first conductive body layer 21.

In this embodiment, the reflective layer 24 is disposed on a side of the repair layer 22 away from the first conductive body layer 21, so that the reflection performance of the anode 20 can be improved, and the light emission efficiency and the light emission uniformity of the OLED display panel 400 can be improved.

Wherein a material of the reflective layer 24 may be a metal, for example, it may include at least one of silver, palladium, copper, aluminum, nickel, or lanthanum. Alternatively, the material of the reflective layer 24 may also be an alloy, such as may include an alloy consisting of at least two of silver, palladium, copper, aluminum, nickel, and lanthanum. For example, the material of the reflective layer 24 may be an alloy consisting of silver, palladium, and copper, or an alloy consisting of aluminum, nickel, copper, and lanthanum, and the material of the reflective layer 24 is not specifically limited in this embodiment.

Figure 5:
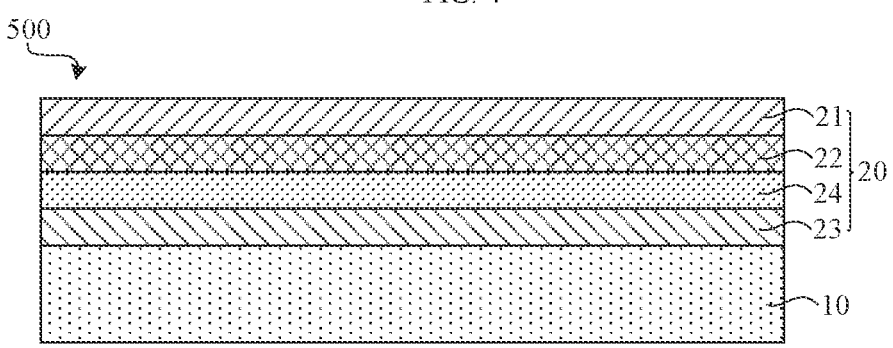
FIG. 5 is a structural schematic diagram of an OLED display panel according to a fifth embodiment of the present application.

Referring to FIG. 5, a fifth embodiment of the present application provides an OLED display panel 500. The OLED display panel 500 provided in the fifth embodiment of the present application differs from the fourth embodiment in that the anode 20 further includes a second conductive body layer 23 located on a side of the reflective layer 24 away from the self-repairing layer 22.

In this embodiment, a material of the second conductive body layer 23 is same as the material of the first conductive body layer 21, and is indium tin oxide.

Specifically, the second conductive body layer 23 is produced by a physical vapor deposition process. Wherein a thickness of the second conductive body layer 23 ranges from 5 nm to 12 nm. In some embodiments, the thickness of the second conductive body layer 23 may be 5 nm, 6 nm, 7 nm, 8 nm, 9 nm, 10 nm, 11 nm, or 12 nm.

Figure 6:
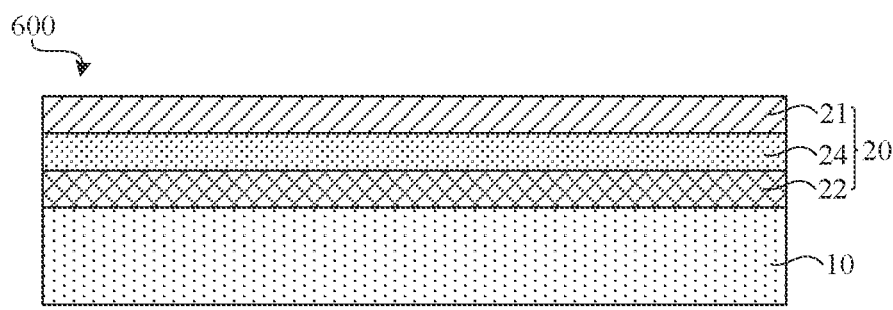
FIG. 6 is a structural schematic diagram of an OLED display panel according to a sixth embodiment of the present application.

Referring to FIG. 6, a sixth embodiment of the present application provides an OLED display panel 600. The OLED display panel 600 provided in the sixth embodiment of the present application differs from the first embodiment in that the anode 20 further includes a reflective layer 24 located on a side of the self-repairing layer 22 close to the first conductive body layer 21.

In this embodiment, the reflective layer 24 is disposed on the side of the self-repairing layer 22 close to the first conductive body layer 21, so that the reflection performance of the anode 20 can be improved, and further the light emission efficiency and the light emission uniformity of the OLED display panel 600 can be improved.

Wherein a material of the reflective layer 24 may be a metal, such as may include at least one of silver, palladium, copper, aluminum, nickel, or lanthanum. Alternatively, the material of the reflective layer 24 may also be an alloy, for example, it may include an alloy consisting of at least two of silver, palladium, copper, aluminum, nickel, and lanthanum. For example, the material of the reflective layer 24 may be an alloy consisting of silver, palladium, and copper or an alloy consisting of aluminum, nickel, copper, and lanthanum, and the material of the reflective layer 24 is not specifically limited in this embodiment.

Figure 7:
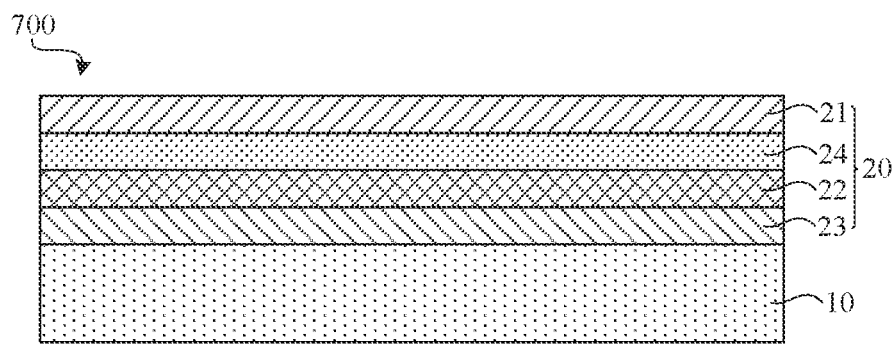
FIG. 7 is a structural schematic diagram of an OLED display panel according to a seventh embodiment of the present application.

Referring to FIG. 7, a seventh embodiment of the present application provides an OLED display panel 700. The OLED display panel 700 provided in the seventh embodiment of the present application differs from the sixth embodiment in that the anode 20 further includes a second conductive body layer 23 located on a side of the self-repairing layer 22 away from the reflective layer 24.

In this embodiment, a material of the second conductive body layer 23 is same as the material of the first conductive body layer 21, and is indium tin oxide.

Specifically, the second conductive body layer 23 is prepared by a physical vapor deposition process. Wherein, a thickness of the second conductive body layer 23 ranges from 5 nm to 12 nm. In some embodiments, the thickness of the second conductive body layer 23 may be 5 nm, 6 nm, 7 nm, 8 nm, 9 nm, 10 nm, 11 nm, or 12 nm.

The present application further provides a display device which may be a display product such as a mobile phone, a tablet, a notebook computer, a television, or the like. Wherein, the display device includes a housing and an OLED display panel disposed in the housing, the OLED display panel may be the OLED display panel described in any of the foregoing embodiments, and a specific structure of the OLED display panel may be described with reference to the foregoing embodiments, and details are not described herein again.

The foregoing describes in detail an OLED display panel and a display device provided in the embodiments of the present application. The principles and embodiments of the present application are described by using specific examples. The description of the embodiments is merely intended to help understand the method and core ideas of the present application. At the same time, a person skilled in the art may make changes in the specific embodiments and application scope according to the idea of the present application. In conclusion, the content of the specification should not be construed as a limitation to the present application.

What is claimed is:

1. An OLED display panel, wherein, the OLED display panel comprises:
   a substrate; and
   an anode comprising a first conductive body layer and a self-repairing layer, wherein the self-repairing layer is located on a side of the first conductive body layer close to the substrate;
   wherein the self-repairing layer comprises a self-repairing material, and the self-repairing material comprises one or more of polydimethylsiloxane-4,4'-methylene phenyl isocyanate, polydimethylsiloxane-4,4'-4,4'-hexamethylenebiurea, or polydimethylsiloxane-4,4'-methylene phenyl isocyanate-4,4'-hexamethylenebiurea;
   wherein the self-repairing layer further comprises a reflective material; the reflective material comprises at least one of silver, palladium, copper, aluminum, nickel, or lanthanum; or
   the reflective material comprises an alloy consisting of at least two of silver, palladium, copper, aluminum, nickel, or lanthanum.

2. The OLED display panel according to claim 1, wherein the anode further comprises a second conductive body layer, the second conductive body layer is located on a side of the self-repairing layer close to the substrate, and a material of the second conductive body layer is same as a material of the first conductive body layer.

3. The OLED display panel according to claim 2, wherein the material of the first conductive body layer and the material of the second conductive body layer are indium tin oxide, the material of the self-repairing layer comprises the polydimethylsiloxane-4,4'-methylene phenyl isocyanate-4, 4'-hexamethylenebiurea and sliver nanowire; and
   a thickness of the first conductive body layer and a thickness of the second conductive body layer both range from 5 nm to 12 nm, and the thickness of the self-repairing layer ranges from 80 nm to 150 nm.

4. The OLED display panel according to claim 1, wherein the anode further comprises a reflective layer located on a side of the self-repairing layer away from the first conductive body layer.

5. The OLED display panel according to claim 1, wherein the anode further comprises a reflective layer located on a side of the self-repairing layer close to the first conductive body layer.

6. The OLED display panel according to claim 1, wherein the self-repairing layer is prepared by a coating process or a vapor deposition process.

7. The OLED display panel according to claim 1, wherein a thickness of the self-repairing layer ranges from 80 nm to 150 nm.

8. A display device, comprising an OLED display panel, wherein the OLED display panel comprises:
   a substrate; and
   an anode comprising a first conductive body layer and a self-repairing layer, wherein the self-repairing layer is located on a side of the first conductive body layer close to the substrate;
   wherein the self-repairing layer comprises a self-repairing material, and the self-repairing material comprises one or more of polydimethylsiloxane-4,4'-methylene phenyl isocyanate, polydimethylsiloxane-4,4'-4,4'-hexamethylenebiurea, or polydimethylsiloxane-4,4'-methylene phenyl isocyanate-4,4'-hexamethylenebiurea;
   the self-repairing layer further comprises a reflective material; the reflective material comprises at least one of silver, palladium, copper, aluminum, nickel, or lanthanum; and/or
   the reflective material comprises an alloy consisting of at least two of silver, palladium, copper, aluminum, nickel, or lanthanum.

9. The display device according to claim 8, wherein a thickness of the self-repairing layer ranges from 80 nm to 150 nm.

10. The display device according to claim 8, wherein the anode further comprises a second conductive body layer, the second conductive body layer is located on a side of the self-repairing layer close to the substrate, and a material of the second conductive body layer is same as a material of the first conductive body layer.

11. The display device according to claim 10, wherein the material of the first conductive body layer and the material of the second conductive body layer are indium tin oxide, the material of the self-repairing layer comprises the polydimethylsiloxane-4,4'-methylene phenyl isocyanate-4,4'-hexamethylenebiurea and sliver nanowire.

12. The display device according to claim 10, wherein a thickness of the first conductive body layer and a thickness of the second conductive body layer both range from 5 nm to 12 nm, and the thickness of the self-repairing layer ranges from 80 nm to 150 nm.

13. The display device according to claim 8, wherein the anode further comprises a reflective layer on a side of the self-repairing layer away from the first conductive body layer.

14. The display device according to claim 8, wherein the anode further comprises a reflective layer located on a side of the self-repairing layer close to the first conductive body layer.

15. The display device according to claim 8, wherein the self-repairing layer is prepared by a coating process or a vapor deposition process.

* * * * *